United States Patent
Gehring et al.

(10) Patent No.: US 8,112,054 B2
(45) Date of Patent: Feb. 7, 2012

(54) TRI-STATING A PHASE LOCKED LOOP TO CONSERVE POWER

(75) Inventors: Mark R. Gehring, Portland, OR (US); Nathan Moyal, West Linn, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 1053 days.

(21) Appl. No.: 11/467,346

(22) Filed: Aug. 25, 2006

(65) Prior Publication Data

US 2007/0082635 A1  Apr. 12, 2007

Related U.S. Application Data

(60) Provisional application No. 60/720,858, filed on Sep. 26, 2005.

(51) Int. Cl.
*H04B 1/06* (2006.01)
(52) U.S. Cl. .................. 455/260; 455/108; 327/157
(58) Field of Classification Search .............. 455/260
See application file for complete search history.

(56) References Cited

U.S. PATENT DOCUMENTS

| | | | |
|---|---|---|---|
| 5,764,108 A * | 6/1998 | Rose et al. | 331/17 |
| 5,774,023 A * | 6/1998 | Irwin | 331/17 |
| 6,043,695 A * | 3/2000 | O'Sullivan | 327/157 |
| 6,404,291 B1 | 6/2002 | Riley | |
| 6,472,915 B1* | 10/2002 | Moyal et al. | 327/157 |
| 6,566,923 B1* | 5/2003 | Pettersen | 327/157 |
| 6,754,341 B2 | 6/2004 | Scott et al. | |
| 6,831,562 B2 | 12/2004 | Rodgers et al. | |
| 6,993,300 B2* | 1/2006 | Luo et al. | 455/108 |
| 7,420,427 B2* | 9/2008 | Brown et al. | 331/16 |

OTHER PUBLICATIONS

PCT International Preliminary Report on Patent Liability (Chapter 1 of the PCT) for Int'l. Application No. PCT/US2006/035778, filing date Sep. 12, 2006, mailed Apr. 3, 2008, (2 pgs.).
PCT Written Opinion of the International Searching Authority for Int'l. Application No. PCT/US2006/035778, filing date Sep. 12, 2006, mailed Apr. 3, 2008, (4 pgs.).

* cited by examiner

*Primary Examiner* — Duc Nguyen
*Assistant Examiner* — Ajibola Akinyemi

(57) ABSTRACT

In a system with an intermittently operating radio, the frequency of which is controlled by a Phase Locked Loop (PLL), a method and system for reducing the power consumed by the PLL by tri-stating the control capacitor in the PLL after the PLL has stabilized at a design frequency. After the capacitor is stabilized, power to some of the components in the PLL is reduced.

18 Claims, 4 Drawing Sheets

Figure 1A
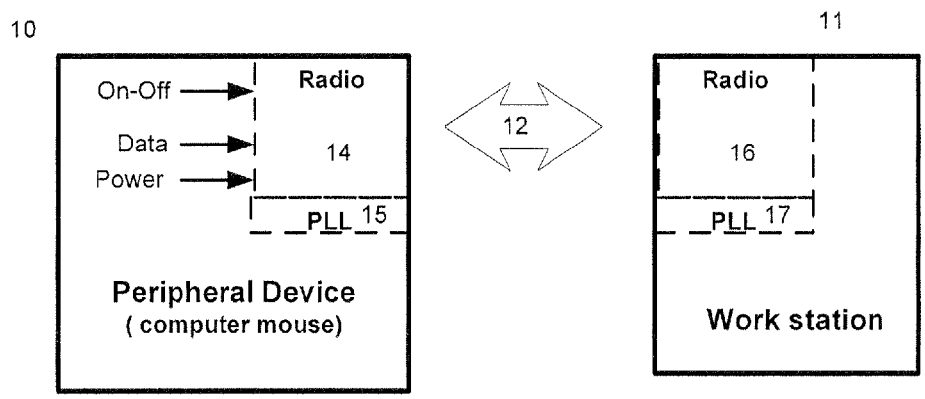
Figure 1B
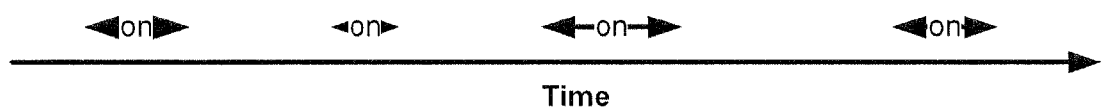
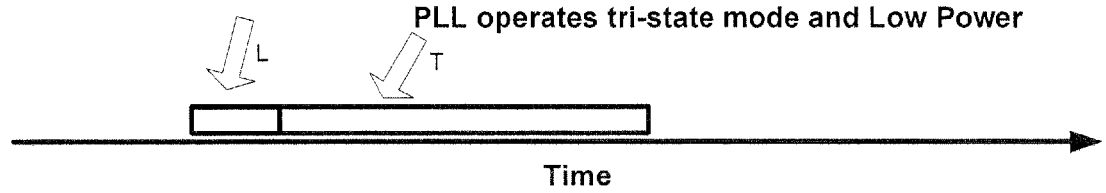
Figure 1C ial application Ser. No. 60/720,858, filed Sep. 26, 2005.
TRI-STATING A PHASE LOCKED LOOP TO CONSERVE POWER

RELATED APPLICATION AND PRIORITY CLAIM

This application is a non-provisional application of provisional application Ser. No. 60/720,858, filed Sep. 26,2005. Priority is claimed to the filing date of provisional application Ser. No. 60/720,858. The entire content of provisional application 60/720,858 is hereby incorporated herein by reference.

FIELD OF THE INVENTION

The present invention relates to electronic circuitry and more particularly the present invention relates to Phase Locked Loop (PLL) circuitry.

BACKGROUND

Phase locked loops provide a very precise reference frequency. Furthermore PLLs can be used to multiply or divide clock signals. For example an input clock of 10 Mhz can be multiplied by the PLL to produce a 1000 Mhz output signal. Phase locked loops are often used to control the frequency of radio receivers or transmitters.

In many devices that include radio receivers and/or transmitters, power conservation is of great concern. For example, in battery powered devices, low power consumption is desired in order to extend the operating time of the battery.

In some devices that include radio receivers or transmitters, the radio is only operative periodically for short intervals. In such devices the PLL that controls the frequency of the radio is operative for the entire time that the radio is operative.

The method and system described herein is directed to decreasing the amount of power consumed by a PLL that is only periodically operative for short intervals.

BRIEF DESCRIPTION OF THE FIGURES

FIG. 1A is an overall systems diagram of a first embodiment.

FIG. 1B is a time line showing the on-off periods of the radio.

FIG. 1C indicates different phases in the operation of the PLL.

DETAILED DESCRIPTION

Figure 2A:
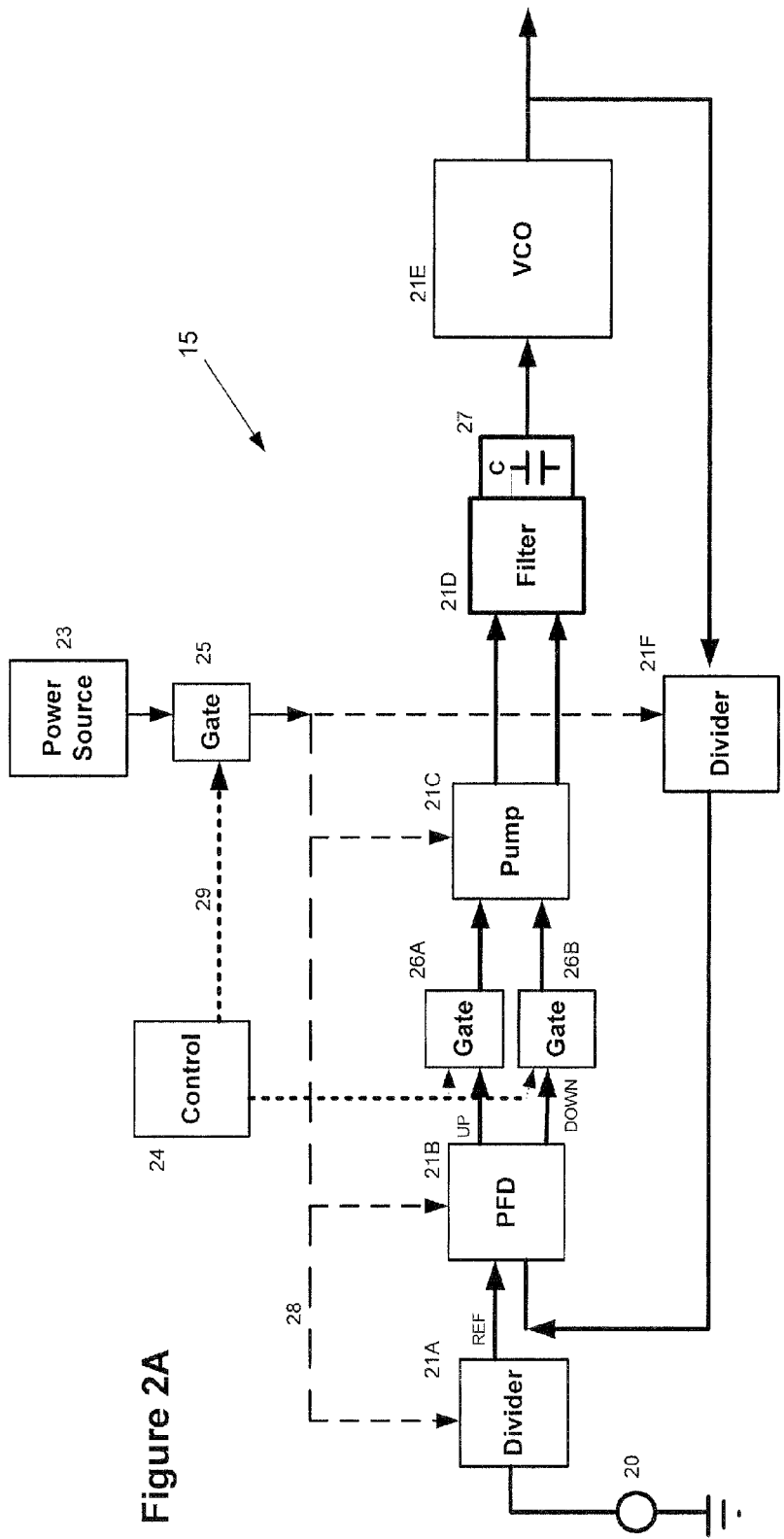
FIG. 2A shows in more detail the PLL shown in FIG. 1.

Several preferred embodiments of the present invention will now be described with reference to the accompanying drawings. Various other embodiments of the invention are also possible and practical. This invention may be embodied in many different forms and the invention should not be construed as being limited to the embodiments set forth herein.

The figures listed above illustrate the preferred embodiments of the invention and the operation of such embodiments. In the figures, the size of the boxes is not intended to represent the size of the various physical components. Where the same element appears in multiple figures, the same reference numeral is used to denote the element in all of the figures where it appears.

Only those parts of the various units are shown and described which are necessary to convey an understanding of the embodiments to those skilled in the art. Those parts and elements not shown are conventional and known in the art.

The first preferred embodiment illustrated in FIG. 1A includes a peripheral device 10 and a work station 11. The peripheral device 10 is wirelessly connected to the workstation 11 by a radio link indicated by the arrow 12. The peripheral device 10 in this example is a computer mouse; however, it could be any other type of peripheral device such as a keyboard, a joystick, etc. Furthermore, other embodiments of the invention involve radio links between other types of devices.

The peripheral device 10 includes a radio 14, which utilizes a signal from a PLL 15. The workstation 11 includes a radio 16 which utilizes a signal from a PLL 17. It is noted that the radios 14 and 16 utilize the PLLs to produce signals of a particular frequency. Each radio then uses the signals from the associated PLL, either directly or in combination with other signals, to tune the radio's frequency.

The radio 14 in the peripheral device 10 is only periodically operable. In the embodiment where the peripheral device 10 is a computer mouse, the radio 14 is only operable when the mouse is moved. In an embodiment where the peripheral device is a keyboard, the radio is only operable for a short period of time when a key is pressed. In the embodiment shown here, the radio 16 in the workstation 11 is constantly operable (since power is not as critical in workstation 11); however in other embodiments, the radio in workstation 11 is also only periodically operable.

FIG. 1B illustrates an example of the time periods during which radio 14 is active. However, for the purpose of illustration the time lines and the time periods are not to scale. In a typical application, that includes a computer mouse communicating with a work station, the radio in the computer mouse would only be operable for in the neighborhood of about one percent of the time in a normal type of application. Naturally, the actual amount of time that the radio is operative depends on the particular application and the particular user of the peripheral device. However, in many applications the radio 14 is only operable for a small percentage of time.

In the embodiment shown in FIG. 1A, each of the periods during which the radio 14 is active is divided into two parts as shown in FIG. 1C. The time periods are designated L and T. During the time period L, the PLL 15 operates in a normal manner and locks onto the design frequency. During time period T, the PLL 15 is tri-stated so that it utilizes less power. That is, during period T, the PLL continues to provide a frequency reference for the radio 14; however, in a manner described below, it is switched to a state that utilizes less power.

FIG. 2A illustrates the major components in a first embodiment of the PLL 15. The forward path of the PLL 15 includes a crystal 20, a frequency divider 21A, a phase-frequency detector (PFD) 21B, a charge pump 21C, a filter 21D and a voltage controlled oscillator (VCO) 21E. The feedback path includes a frequency divider 21F. A capacitor 27 which is part of the filter 21D provides a control voltage to VCO 21E.

Figure 2B:
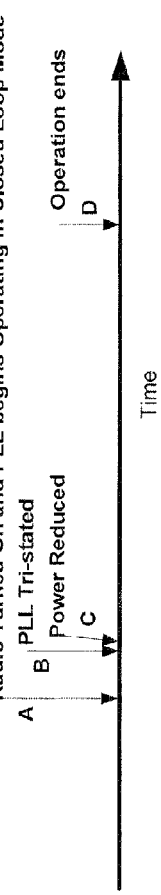
FIG. 2B shows a time line related to the circuit shown in FIG. 2A.

FIG. 2B shows a time line in the operation of the PLL 15. Four times, designated A, B, C and D in FIG. 2B will be discussed. The length of each time period depends upon a variety of detailed design considerations. In the discussion below, the length of each time period is given for the specific embodiment described herein, but, it should be understood the length of the time periods will differ in other embodiments.

Time A: At time A, the radio 14 is turned on and the PLL begins operating in a normal closed loop manner. Between time A and time B the PLL stabilizes at the desired frequency. In the embodiment shown herein, the time required for the PLL to stabilize to the design frequency, that is, the time period between time A and time B is about 100 microseconds. In other embodiments the time period A will be longer or shorter.

Time B: After the frequency is stabilized, the PLL loop is opened. That is, the PLL is tri-stated at time B. After the PLL is tri-stated the PLL continues to produce a frequency signal that is within an acceptable frequency range and radio 14 continues operating. The charge on capacitor 27 remains essentially constant, and thus, the control signal to VCO 21E remains constant.

Time C: Shortly after the PLL is tri-stated, the power to certain components in the PLL is reduced. Since the PLL is operating in an open loop or tri-stated manner, reducing the power to certain components has no affect on the signal produced by the PLL. In the embodiment shown here, the time between when the PLL is tri-stated (time B) and when the power to certain components is reduced (time C) is about 5 microseconds, The time gap between time B and time C merely need be long enough to allow the tri-stating to take effect before the power is reduced. The radio 14 continues to operate after time C.

Time D: Finally after a period of time the radio is turned off and the PLL is turned off. It is noted that the capacitor 27 can maintain its charge within an acceptable range (and thus the frequency of the PLL can be maintained) for about 5 milliseconds (note this time is in milliseconds and the other times given above were in microseconds). Thus, in the embodiment shown here, the time between time B and time D can be up to 5 milliseconds. In embodiments that include a peripheral device such as a mouse or a keyboard communicating with a work station, this is more than a sufficient amount of time to transmit the required data. However, in other embodiments, the time period between time B and time D, can be longer or shorter than 5 milliseconds depending on how long the capacitor in those embodiments can hold charge and how long the radio need be on.

In the embodiment shown in FIG. 2A, the PLL 15 is tri-stated and power is controlled by gates 25, 26A and 26B. Power is supplied to the divider 21A, the PFD 21B, the charge pump 21C, and the divider 21F by the power source 23. Gate 25 controls the flow of power from the power source 23 to the divider 21A, the PFD 21B, the charge pump 21C, the filter 21D and the divider 21F.

Gates 26A and 26B control the flow of UP and DOWN signals from the PFD 21B to the charge pump 21C. Gates 25, 26A and 26B are operated by signals from a control unit 24.

When the gates 25, 26A and 26B are closed, the circuit operates as a conventional PLL. That is, the feedback signal from divider 21F is compared to the reference signal from divider 21A. If there is a difference, an appropriate UP or DOWN signal is provided to charge pump 21C and the charge pump 21C increases or deceases the charge on capacitor 27.

When gates 26A and 26B are opened (i.e. floating), no UP or DOWN signals from PFD 21B are gated to charge pump 21C. Thus the capacitor 27 is tri-stated. That is, its charge remains constant except for any leakage current that may be present. However, for about 5 milliseconds, the charge remains constant enough that the frequency of the VCO 21E remains within an acceptable range.

In summary, the PLL circuit shown in FIG. 2A operates as follows.

1) When the radio 14 is turned on, the PLL is powered up and within about 100 microseconds the PLL stabilizes to the appropriate frequency. After the PLL has stabilized the radio 14 begins operating.

2) After about 5 microseconds gates 26A and 26B are opened and the capacitor 27 is tri-stated. That is, no additional charge is added to or withdrawn from the capacitor 27 and the VCO continues producing signals that are within an acceptable frequency range. The radio 14 continues to operate after gates 26A and 26B are opened.

3) A short time after gates 26A and 26B have been opened, gate 25 is opened, thereby powering down the divider 21A, the PFD 21B, the divider 21F. The radio 14 continues to operate after gate 25 is opened.

4) Finally after some number of milliseconds the radio 14 is turned off and the radio 14 and the PLL 15 wait for the next cycle.

Many different detailed implementations of the circuit shown in FIG. 2A are possible. The art of designing PDF circuits, charge pumps, filters and VCOs is highly developed and many different designs can be used in the embodiment shown in FIG. 2A.

Figure 3:
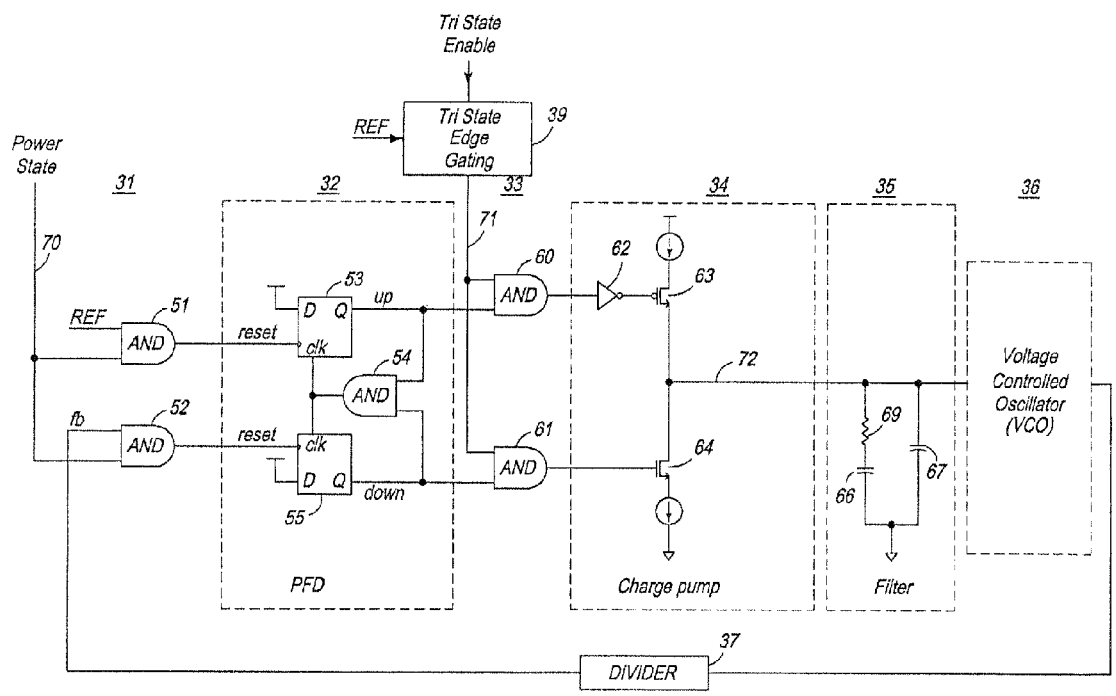
FIG. 3 is a circuit diagram of an embodiment.

FIG. 3 shows one particular detailed implementation of an embodiment of the invention. The embodiment shown in FIG. 3 is similar to the embodiment shown in FIG. 2A; however, the way in which the power to the various components is reduced after the input to the VCO is tri-stated differs from that shown in FIG. 2A.

For purpose of explanation the circuit shown in FIG. 3 is divided into seven sections as follows: power down circuit 31, PFD 32, tri-state gates 33, charge pump 34, filter 35, VCO 36, divider 37 and tri-state edge gating circuit 39. The specific design described here is designed to produce and output signal of 2.4 gigahertz.

It is noted that the sections 31 to 39 are shown separately in FIG. 3, merely for the purposes of illustration and explanation. The actual circuitry includes the components shown, connected as shown; however, the circuitry need not be laid out or divided into the sections as illustrated in FIG. 3.

The PFD 32 includes flip-flops 53 and 55, and AND circuit 54. Operating in a normal manner, PFD compares the feedback signal from divider 37 to the reference signal REF. PFD 32 generates UP and DOWN signals that indicate if the frequency need be increased or decreased. It is noted that the source of the reference signal REF is not illustrated in FIG. 3. The REF signal could be generated by a crystal and divided as illustrated in FIG. 2A.

The charge pump 34 includes inverter 62 and FET transistors 63 and 64. Charge pump 34 increases or decreased the signal on the line 72 which goes to the filter 35 in response to the UP and DOWN signals from the PFD 32. The filter 35 includes resistor 69 and capacitors 66 and 67. In response to the signal from charge pump 34, filter 35 provides a voltage signal that controls the frequency of voltage controlled oscillator (VCO) 36.

In the particular embodiment illustrated here, the resistors and capacitors in filter 35 have the following values:

Resistor 69: 10K ohms
Capacitor 66: 200 Pico farads
Capacitor 67: 20 Pico farads The VCO 36 is a VCO with a high input impedance. The frequency of the output signal produced by the VCO 36 is controlled by the voltage on the input line from filter 35. Such VCO's are commercially available.

In this embodiment, the REF signal has a frequency of 1 Mhz. The radio which the PLL controls operates in bursts lasting less than 500 milliseconds. Thus, when the capacitor 66 is tri-stated, the PLL maintains its frequency for 500 milliseconds. The amount of time that the capacitor can maintain its charge depends upon the amount of leakage current and the time give above can be achieved with commercially available components.

When the PLL is activated (i.e. when the radio, the frequency of which is controlling is turned on) the power state signal 70 and the tri-state signal 71 are made high. When signal 70 is high, the AND circuit 51 passes the REF signal to the PFD 32. When the tri-state signal 71 is high, the UP and DOWN signals from PFD 32 are passed to the charge pump 34. Thus, when the signals 70 and 71 are high, the circuit acts as a normal PLL and after a brief period it locks into the design frequency. The circuit shown requires approximately 100 microseconds to lock to the frequency of 2.4 gigahertz.

After the PLL has stabilized, the tri-state signal 71 goes low and thus, the UP and DOWN signals from the PFD 32 no longer reach charge pump 34.

Next the power state signal 70 goes low. When power state signal 70 is low, neither the REF signal, nor the feedback signal pass through AND gates 51 and 52. This prevents the circuitry in the PFD from changing state, thereby conserving power. It is noted that since signal 71 is low, transistors 63 and 64 do not change state, thereby also conserving power.

Representative time periods for the operation of the circuit shown in FIG. 3 are as follows.

Consider a PLL operating at a frequency of 2.4 Gigahertz which is turned on when a radio is turned on:

1) Time required for PLL to stabilize after circuit activated: 100 microseconds.

2) Time interval between when tri-state signal 71 goes low and when power signal 70 goes low: 5 microseconds.

3) Length of time that the PLL can be in tri-state mode and maintain frequency within specifications: 500 milliseconds.

It is noted that a wide variety of other embodiments are possible. In each such embodiment, the PLL locks to a frequency and it is then tri-stated and it continues to provide a frequency signal in an open loop fashion. When the PLL is in the tri-state condition the power consumption of some of the components in the PLL is reduced, thereby conserving power.

Figure 4:
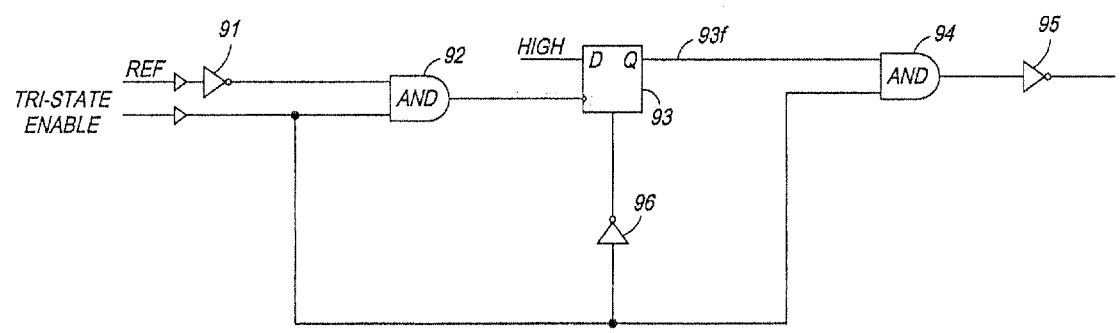
FIG. 4 is a circuit diagram of the tri-state controls shown in FIG. 3.

FIG. 4 shows the details of tri-state edge gating circuit 39. That is, FIG. 4 shows a logic control circuit that enables a PLL tri-state signal on line 71. The circuit shown in FIG. 4 has two inputs, the tri-state enable signal and the REF signal. The REF signal is the same REF signal as provided to AND gate 51 shown in FIG. 3.

The REF input is coupled to a first inverter 91, and the output of the first inverter is coupled to a first input of a first AND gate 92. A second input of the first AND gate 92 is the tri-state enable signal. The output of the AND gate 92 is coupled to a clock input of flipflop 93.

The flipflop 93 has an always"High" signal coupled to the data input. The Q output provides a first input of a second AND gate 94. A second input of the AND gate 94 is coupled to the PLL tri-state enable signal, and to the input of an inverter 96. The output of the inverter 96 is coupled to a Set/Reset input of the flipflop 93. The output of the second AND gate 94 goes to an inverter 95 which produces the output signal on line 71.

In the circuit of FIG. 4, when PLL tri-state enable signal is low, the signal on line 93ƒ one and the output of AND circuit 94 are low; however the output of inverter 95 is high. When PLL tri-state enable signal is high, the falling edge of the clock input will cause line 93ƒ and the output of AND circuit 94 to go high and the output of inverter 95 to go low. The output of inverter 95 stays low as long as the Tri-state enable signal is high. Once Tri-state enable goes low, the signal on line 93ƒ is reset to low and the output of inverter 95 goes high.

By using a clock that has a known relationship to the signals inside the PLL, a user can be sure that the power down sequence does not disturb the PLL. For example, some PLLs in some embodiments use the rising edge of the reference clock to perform internal tasks. By using the falling edge of the reference clock to time the power down sequence we guarantee that internal PLL functionalities are not impacted.

While the invention has been shown and described with respect to preferred embodiments thereof, it should be understood that a wide variety of other embodiments are possible without departing from the scope and sprit of the invention. The scope of the invention is only limited by the appended claims.

We claim:

1. A method of operating a system that includes a Phase Locked Loop (PLL) that controls a frequency of a radio, said radio only operating for short periods of time, said method comprising:

at the beginning of a particular operating period of said radio, operating said PLL in a closed loop manner to stabilize an output frequency of said PLL;

after the output frequency of said PLL has stabilized, tri-stating said PLL, wherein said PLL includes a capacitor that controls the output frequency of said PLL, a phase frequency detector and a charge pump, and wherein tri-stating said PLL comprises preventing charge from being added to and removed from said capacitor and tri-stating said phase frequency detector and said charge pump;

preventing power from flowing to said phase frequency detector (PFD) and said charge pump of the PLL; and continuing to operate said tri-stated PLL for a remainder of said particular operating period to provide a frequency reference to said radio.

2. The method recited in claim 1, wherein said phase frequency detector (PFD) provides signals to said charge pump, and wherein said PLL is tri-stated by preventing signals from said PFD from reaching said charge pump.

3. The method recited in claim 1, wherein said PLL includes a filter and a voltage controlled oscillator (VCO) connected in a forward loop with the PFD and the charge pump, and wherein said PLL is tri-stated by opening a connection between said PFD and said charge pump.

4. The method recited in claim 1, wherein said PLL includes a filter and a voltage controlled oscillator connected in a forward loop with the PFD and the charge pump and a frequency divider connected in a feedback loop between said VCO and said PFD, and wherein said method further includes:

tri-stating said PLL by opening a connection between said PFD and said charge pump; and reducing the power consumed by said PLL after said PLL is tri-stated by opening a connection between said frequency divider and said PFD.

5. The method recited in claim 1, wherein said PLL has a reference input signal that has pulses, each of which has a raising edge and a falling edge, and wherein said method further includes tri-stating said PLL at a time of a trailing edge of a pulse on said reference input.

6. A method of operating a Phase Locked Loop (PLL) that includes a capacitor, the charge on which determines a frequency of an output signal provided by said PLL, said PLL including a phase frequency detector (PFD) and a charge pump, said method comprising the steps of:
first allowing said PLL to stabilize at a particular frequency and the charge on said capacitor to stabilize at a particular value;
after said charge on said capacitor has stabilized, tri-stating said capacitor so that no additional charge is added to and removed from said capacitor and tri-stating said PFD and said charge pump; and
reducing the power used by said PFD when said capacitor is tri-stated by preventing power from flowing to said PFD and said charge pump of said PLL.

7. The method of claim 6, wherein said method further includes opening paths that cause charge to be added to or removed from said capacitor in order to tri-state said capacitor.

8. The method recited in claim 6, wherein said PFD provides signals to said charge pump, and wherein said PLL is tri-stated by preventing signals from said PFD from reaching said charge pump.

9. The method recited in claim 6, wherein said PLL has a reference input signal that has pulses, each of which has a raising edge and a falling edge, and wherein said method further includes tri-stating said PLL at a time of a trailing edge of a pulse on said reference input.

10. The method of claim 6, wherein preventing power from flowing to said PFD and said charge pump of said PLL comprises opening a gate between a power source and said PFD and said charge pump, wherein said gate is controlled by a PLL control unit.

11. A system comprising:
a radio that is intermittently operable for short periods of time;
a phase locked loop (PLL) that controls a frequency of said radio, said PLL having a plurality of units connected in a loop having a forward path and a feedback path, the plurality of units comprising a phase-frequency detector and a charge pump;
a capacitor, a charge on which controls a frequency of said PLL;
gates for tri-stating said capacitor, said phase-frequency detector, and said charge pump after said capacitor has stabilized whereby charge cannot be added to and removed from said capacitor; and
gates for reducing power consumed by said units in said PLL after said capacitor is tri-stated, wherein said gates for reducing power prevent power from flowing to said phase-frequency detector (PFD) and said charge pump of the PLL.

12. The system recited in claim 11, wherein said gates for reducing the power consumed by said units in said PLL open said feedback path whereby said loop is open circuited and the power consumed by said PLL is reduced.

13. The system recited in claim 11, wherein said PLL comprises:
a charge pump, a filter and a Voltage Controlled Oscillator (VCO) connected in a forward loop with the PFD, said capacitor being part of said filter.

14. The system recited in claim 13, wherein said gates for tri-stating said capacitor open a connection between said PFD and said charge pump.

15. The system recited in claim 13, wherein said system further comprises:
a gating circuit for opening inputs to said PFD after said capacitor has been tri-stated to reduce the power consumed by said PFD and said charge pump after said capacitor has been tri-stated.

16. The system recited in claim 11, wherein said PLL includes a frequency divider in said feedback path.

17. The system recited in claim 11, further comprising a computer peripheral device, data from which is transmitted by said radio.

18. The system recited in claim 11, wherein said forward path includes a voltage controlled oscillator, an output frequency of which controlled by said capacitor.

* * * * *